(12) United States Patent
Shih

(10) Patent No.: US 7,442,048 B2
(45) Date of Patent: Oct. 28, 2008

(54) CONNECTOR AND PORTABLE ELECTRONIC DEVICE USING THE SAME

(75) Inventor: Wei-Kuo Shih, Tainan Hsien (TW)

(73) Assignee: Chi Mei Communication Systems, Inc., Tu-Cheng, Taipei County (TW)

( * ) Notice: Subject to any disclaimer, the term of this patent is extended or adjusted under 35 U.S.C. 154(b) by 0 days.

(21) Appl. No.: 11/741,478

(22) Filed: Apr. 27, 2007

(65) Prior Publication Data

US 2008/0045050 A1    Feb. 21, 2008

(51) Int. Cl.
*H01R 12/00* (2006.01)
(52) U.S. Cl. .......................................... 439/68; 439/70
(58) Field of Classification Search ............... 439/68, 439/70, 79, 72
See application file for complete search history.

(56) References Cited

U.S. PATENT DOCUMENTS 7,223,125 B2 * 5/2007 Chen ........................ 439/609
2005/0070133 A1 * 3/2005 Canella ...................... 439/70
2006/0063399 A1 * 3/2006 Li .............................. 439/70
2006/0099835 A1 * 5/2006 Alger et al. ................ 439/70
2006/0189177 A1 * 8/2006 Goodman et al. ......... 439/70
2006/0246750 A1 * 11/2006 Li .............................. 439/68

* cited by examiner

*Primary Examiner*—Gary F. Paumen
(74) *Attorney, Agent, or Firm*—Steven M. Reiss

(57) ABSTRACT

A connector (20) is coupled with a circuit board (10) of a portable electronic device, and the circuit board includes a board hole (12) therein and a plurality of conductive pads (14) thereon, adjacent the board hole. The connector includes a housing (22) and a plurality of conducting terminals (24). The housing has an open end and includes a top wall (222) and sidewall (224), with the top wall and the sidewall together co-operatively defining a cavity (220). The plurality of conducting terminals is positioned near/proximate the open end of the housing. The housing is fixed with circuit board corresponding with the board hole and is electronically connected with the conductive pads via the conducting terminals.

18 Claims, 3 Drawing Sheets

CONNECTOR AND PORTABLE ELECTRONIC DEVICE USING THE SAME

BACKGROUND OF THE INVENTION

1. Field of the Invention

The present invention relates to connectors and, especially, to a connector and a portable electronic device using the same.

2. Description of Related Art

Nowadays, multi-functional portable electronic devices are becoming more and more popular. A portable electronic device with a camera module is a typical example. In use, the camera module transmits a signal from an image sensor thereof to the PCB (printed circuit board) of the portable electronic device.

The camera module is typically connected with the portable electronic device via a socket connector. Usually, the socket connector is trough-shaped and opens to the air. Such a socket connector includes a main body and a plurality of terminals. The main body includes a bottom wall and four sidewalls, together defining a cavity. The terminals are inserted beyond the bottom wall or the sidewalls and thereby partly extend into the cavity. The camera module is contained in the cavity of the socket connector and electronically connected with the terminals thereof. The terminals of the socket connector are, in turn, electronically connected with the PCB, e.g., by surface mounting technology.

The thickness of each of the bottom wall and the PCB may increase the connector bulk of the camera module and, consequently, increase the bulk of the portable electronic device.

SUMMARY

Therefore, a connector and a portable electronic device that occupy less volume is desired.

In one aspect thereof, a connector is coupled with a circuit board of a portable electronic device, and the circuit board includes a board hole therein and a plurality of conductive pads thereon, adjacent the board hole. The connector includes a housing and a plurality of conducting terminals. The housing has an open end and includes a top wall and sidewall, with the top wall and the sidewall together co-operatively defining a cavity. The plurality of conducting terminals is positioned near/proximate the open end of the housing. The housing is fixed with circuit board corresponding with the board hole and is electronically connected with the conductive pads via the conducting terminals.

In another aspect thereof, a portable electronic device includes a circuit board, a functional module, and a connector. The circuit board includes a board hole and a plurality of conductive pads around the board hole. The functional (e.g., camera) module includes a plurality of conducting portions. The connector includes a housing and a plurality of conducting terminals. The housing has an open end and includes a top wall and sidewall. The top wall and the sidewall together define a cavity, and the conducting terminals are provided near the open end of the housing. The housing is fixed with circuit board in a position corresponding to that of the board hole and, in particular, is electronically connected with the conductive pads via the conducting terminals. The functional module is held in the cavity and is electronically connected with the circuit board via the connector.

Other advantages and novel features of the present invention will become more apparent from the following detailed description of preferred embodiment when taken in conjunction with the accompanying drawings.

BRIEF DESCRIPTION OF THE DRAWINGS

Many aspects of the present connector and portable electronic device using the same can be better understood with reference to the following drawings. The components in the drawings are not necessarily drawn to scale, the emphasis instead being placed upon clearly illustrating the principles of the present camera module. Moreover, in the drawings, like reference numerals designate corresponding parts throughout the several views.

DETAILED DESCRIPTION OF THE INVENTION

Figure 1:
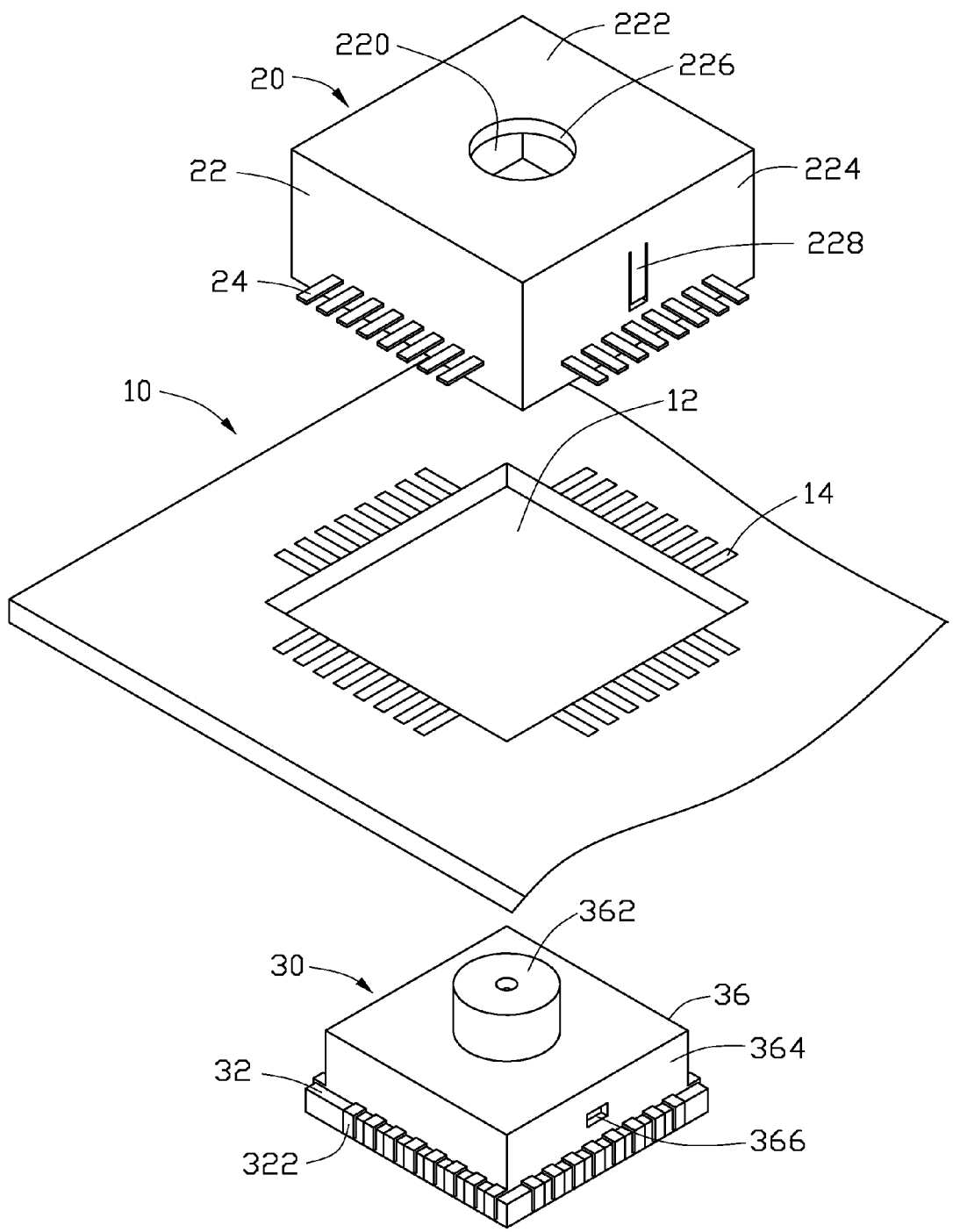
FIG. 1 is an exploded, perspective view of a camera module connector and a camera module using the same, according to a preferred embodiment.
Figure 2:
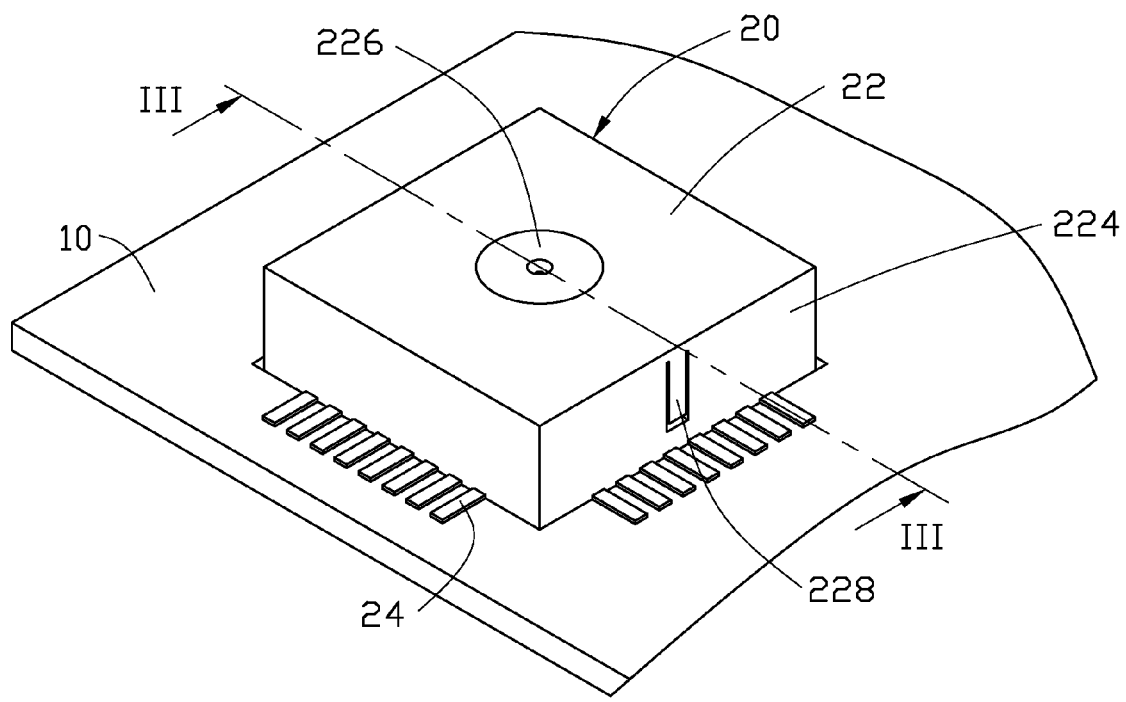
FIG. 2 is an assembled view of the camera module connector and the camera module provided in FIG. 1.
Figure 3:
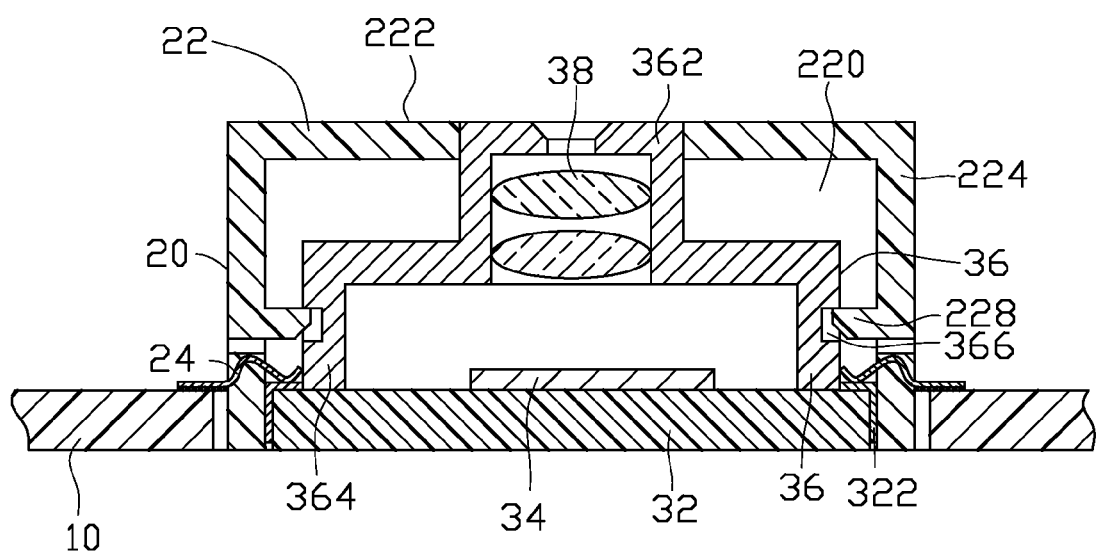
FIG. 3 is a cross-sectional view taken along line III-III of FIG. 2.

Referring to the FIG. 1 to FIG. 3, a camera module 30 (i.e., the particular functional module of the illustrated example) is used for a portable electronic device (not shown), a preferred embodiment of a camera module connector 20 is in the form of a socket configured (i.e., structured and arranged) for connecting a circuit board 10 of a portable electronic device with the camera module 30. The connector 20 respectively corresponds with the circuit board 10 and the camera module 30. The camera module 30 is electronically connected with the circuit board 10 via the connector 20.

The camera module 30 includes, at least, a base 32, an image sensor 34, and a lens module 36. A plurality of conducting portions 322 is provided directly on the base 32, around the perimeter thereof. The image sensor 34 is provided on the base 32 and is electronically connected with the conducting portions 322. The lens module 36 is optically aligned with the image sensor and includes a first end 362 and a second end 364. The first end 362 and the second end 364 are coaxial. The diameter of the first end 362 is less than that of the second end 364. A stage is formed at the joint/intersection of the first end 362 and the second end 364. At least one lens 38 is held in the first end 362. The second end 364 is mounted on the base 32. Two slots 366, for purposes of illustration, are defined in two opposite side surfaces of the second end 364, and it is to be understood that any number of such slots 366 could be provided. The image sensor 34 is provided on the base 32 proximate the second end 364 (e.g., extending somewhat into the space defined therein) and is positioned in accordance with the light path of the lens module 36.

The circuit board 10 is a printed circuit board (PCB) provided in the portable electronic device. A board hole 12 is defined, substantially centrally, in/through the circuit board 10. The board hole 12 is essentially identical in shape to the base 32 of the camera module 30 to permit the board hole 12 to fittingly/matingly receive the base 32 therein. A plurality of conductive pads 14 is at regular intervals provided around the board hole 12.

The connector 20 includes an insulating housing 22 and a plurality of conducting terminals 24. The housing 22 includes a top wall 222 and sidewall 224 that together define a cavity 220, and the housing 22 has a completely open end at one distal end of and in communication with the cavity 220. The cavity 220 is used/configured for containing and retaining the camera module 30. A transparent portion 226 is defined in a center of the top wall 222. The transparent portion 226 can, e.g., be an aperture or made of a transparent material, such as an optical glass or plastic. Two latches 228 are oppositely positioned relative to the sidewall 224 and, in the illustrated embodiment, are integrally formed within the sidewall 224. One end of each such latch 228 is attached to the sidewall 224, while the remainder of the given latch 228 is unattached and free to move. Accordingly, each latch 228 is effectively an elastic cantilever member. The two latches 228, upon assembly of the connector 20 with the camera module 30, respectively engage with the two slots 366 (i.e., each latch 228 is structured and arranged to snap-lock into a respective slot 366).

The free (i.e., unattached to the sidewall 224) end of the latch 228 is basically wedge-shaped and is configured to promote receipt thereof in a corresponding the slot 366. As such, in order be able to mate/fit into a given slot 366, the wedge-shaped free end of each latch 228 must be able to extend inward of the perimeter of the camera module 30. Because of the extension requirement, the wedge-shaped free end must first be initially outwardly displaced away from the camera module 30 (i.e., when guiding the connector 20 initially onto the camera module 30, in ultimately trying to snap one onto the other). Accordingly, the wedge shape thereof makes initial outward elastic displacement easier to achieve during assembly. Even though two slot/latch combinations are illustrated, it is to be further understood that any number of such combinations could be employed, depending on the degree of mechanical connection between the connector 20 and the camera module 30 that is desired (e.g., four slot/latch combinations, each spaced about 90° away from the next, would possibly offer an even higher degree of mechanical stability).

The plurality of conducting terminals 24 is provided proximate the fully open end of the housing 22. As best seen in FIG. 3, a first portion of each of the terminals 24 is respectively mounted in the sidewall 224 of the housing 22 (e.g., moldingly received therein), a second portion of each extends/projects outwardly from the housing 22, and a third portion thereof extends inwardly of the housing 22. The distribution of the conducting terminals 24 in the housing 22 corresponds to the distribution both of the conductive pads 14 of the circuit board 10 and of the conducting portions 322 in the camera module 30. The second portion of each of the terminals 24 outside the housing 22 is soldered or welded to the conductive pads 14 on the circuit board 10, so that the connector 20 is fixed to the circuit board 10. The third portion of each of the terminals 24 inside the housing 22 is electronically connected (e.g., via soldering or welding) to the conducting portions 322 of the camera module 30.

In assembly, the open end of the housing 22 of the connector 20 is inserted within the board hole 22 of the circuit board 20 until the terminals 322 extending from the housing 22 come into contact with the conductive pads 14 of the circuit board 10. The terminals 322 are then welded/soldered on (i.e., directly metallurgically bonded to) the conductive pads 14, yielding both a mechanical and electronic link therebetween. The camera module 30 is put into the connector 20 from bottom (i.e., the open end thereof) to top. The first end 362 of the camera module 30 is provided near and in alignment with the light-through (i.e., light-entrance) portion 226 of the connector 20. The latches 228 of the connector 20 are first outwardly displaced by contact thereof with the step and the second end 364 of the camera, but the latches 228 ultimately reach the corresponding slots 366 in the camera module 30 and elastically snap-fit there into place. When assembled, the circuit board 10, the connector 20, and the camera module 30 are electronically connected via the terminals 24.

It should be understood, the latches 228 or the slots 366 described above can be replaced another form of latching/gripping mechanism. For example, at least one arched elastic piece fixed on the inner wall of the housing 22 may be used instead of the latches 228, or, at least one bulge on the inner wall of the housing 22 and at least one corresponding groove on the side surface of the second end of the camera module 30 may be used instead of the latches 228 and the slots 366, to ensure that the camera module 30 can be fixed to the connector 20.

Through lateral fixation, the connector and the portable electronic device using the same can reduce device height/thickness relative to related technology. Particularly, via use of the connector 20, it is possible to lower the camera module 30 into the board hole 12 of the circuit board 10 to achieve the desired effective reduction in height/thickness. Of course, the camera module connector system can also be used for connecting functional modules other than the camera module 30 to improve compactness in other electronic applications.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A connector connected with a circuit board of a portable electronic device, the circuit board having a plurality of conductive pads formed thereon, the connector comprising:

a housing including a top wall, sidewalls, and a completely open bottom end, the top wall and the sidewalls together defining a cavity communicating with the open end of the housing; and a plurality of conducting terminals proximate the completely open bottom end of the housing, the conducting terminals being mounted in and extending from at least one sidewall of the housing;

wherein the conducting terminals are electronically and mechanically connected with the conductive pads, and thereby the completely open end of the housing is fixed to the circuit board.

2. The connector as described in claim 1, wherein the circuit board has a board hole formed therethrough, the completely open end of the housing being inserted within the board hole of the circuit board.

3. The connector as described in claim 2, wherein the conductive pads on the circuit board are provided around the board hole, the distribution of the conducting terminals corresponding to the distribution of the conductive pads.

4. The connector as described in claim 3, wherein each terminal further including an outer portion and an inner portion, the outer portion of each terminal extends outwardly from the at least one sidewall of the housing, the outer portion of the each terminal is welded or soldered to a respective conductive pad on the circuit board, and the inner portion of each terminal projects inwardly of the sidewall of the housing.

5. The connector as described in claim 1, the sidewalls have at least one latching mechanism associated therewith, and each latching mechanism is configured for fixing the connector with the functional module.

6. The connector as described in claim 5, wherein each latching mechanism is an elastic cantilever body provided in the at least one sidewall of the housing, each elastic cantilever body being configured for snap-fitting into a corresponding slot defined in the functional module.

7. A portable electronic device, comprising:
a circuit board having a board hole therethrough and having a plurality of conductive pads formed thereon, around the board hole;
a functional module including a plurality of conducting portions; and
a connector including a housing and a plurality of conducting terminals, the housing comprising a top wall and sidewalls, the top wall and the sidewalls together define an open end and a cavity communicating with the open end, the conducting terminals are provided in the housing, near the open end thereof;
wherein the open end of the housing is fixed to the circuit board extends into the board hole, the conducting terminals are electronically connected to the conductive pads, the connector is configured so as to hold the functional module in the cavity of the connector, and the conducting portions are electronically connected with the respective conductive pads of the circuit board via conducting terminals of the connector.

8. The portable electronic device as described in claim 7, wherein the distribution of the conducting terminals corresponds to the distribution of the conductive pads.

9. The portable electronic device as described in claim 8, wherein the terminals pierce through the sidewall of the housing and extend outward from the housing, a part of the terminals outside the housing is welded to the conductive pads on the circuit board; the part of the terminals inside the housing are electronically connected with the conducting portions.

10. The portable electronic device as described in claim 7, a gripping mechanism is used for fixing the connector to the functional module.

11. The portable electronic device as described in claim 10, wherein the gripping mechanism is at least one elastic body provided in the sidewall of the housing and at least one slot defined on the functional module, the at least one elastic body is inserted into the at least one slot when assembled.

12. A connector connected with a circuit board of a portable electronic device, the circuit board having a plurality of conductive pads formed thereon, the connector comprising:
a housing including a top wall and sidewalls, the top wall and the sidewalls together defining an open end of the housing and a cavity, the cavity being configured for receiving a functional module of the portable electronic device therein;
a plurality of conducting terminals provided near the open end of the housing, the conducting terminals being mounted in and extending from at least one sidewall of the housing; and
a gripping mechanism used for fixing the housing with the functional module;
wherein the conducting terminals are electronically and mechanically connected with the conductive pads, and thereby the open end of the housing is fixed to the circuit board.

13. The connector as described in claim 12, wherein the circuit board has a board hole formed therethrough, the open end of the housing being inserted within the board hole of the circuit board.

14. The connector as described in claim 13, wherein the conductive pads on the circuit board are provided around the board hole, the distribution of the conducting terminals corresponding to the distribution of the conductive pads.

15. The connector as described in claim 14, wherein the terminals are mounted within the sidewall of the housing, each terminal further including an outer portion and an inner portion, the outer portion of each terminal extends outwardly from at least one sidewall, the outer portion of the each terminal is welded or soldered to a respective conductive pad on the circuit board, and the inner portion of each terminal projects inwardly of the at least one sidewall.

16. The connector as described in claim 12, wherein the functional module has a plurality of conducting portions formed thereon, the conducting terminals each include an inner portion, and each respective inner portion is configured for electronically connecting with a corresponding conducting portion.

17. The connector as described in claim 12, wherein the gripping mechanism is at least one latching mechanism associated with at least one of the sidewalls.

18. The connector as described in claim 17, wherein each latching mechanism is an elastic cantilever body provided in the at least one sidewall of the housing, each elastic cantilever body being configured for snap-fitting into a corresponding slot defined in the functional module.

* * * * *